(12) United States Patent
Uchida et al.

(10) Patent No.: US 11,024,566 B2
(45) Date of Patent: Jun. 1, 2021

(54) SEMICONDUCTOR DEVICE AND METHOD OF MANUFACTURING THE SAME

(71) Applicant: RENESAS ELECTRONICS CORPORATION, Tokyo (JP)

(72) Inventors: Shinichi Uchida, Tokyo (JP); Akio Ono, Ibaraki (JP); Shinichi Kuwabara, Ibaraki (JP); Yasutaka Nakashiba, Ibaraki (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 16/653,127

(22) Filed: Oct. 15, 2019

(65) Prior Publication Data

US 2020/0168545 A1    May 28, 2020

(30) Foreign Application Priority Data

Nov. 27, 2018  (JP) .............................. JP2018-221443

(51) Int. Cl.
*H01L 23/495* (2006.01)
*H01L 23/522* (2006.01)
(Continued)

(52) U.S. Cl.
CPC .... *H01L 23/49558* (2013.01); *H01L 23/3107* (2013.01); *H01L 23/49548* (2013.01);
(Continued)

(58) Field of Classification Search
CPC ..... H01L 27/0288; H01L 28/00; H01L 28/10; H01L 2924/1206; H01L 2924/19042; H01L 23/52; H01L 23/495; H01L 23/49537; H01L 23/49541; H01L 23/49548; H01L 23/49558; H01L 23/49575; H01L 23/49586; H01L 23/645; H01L 23/5227; H01L 21/4821; H01L 21/4825; H01L 2225/1029; H01L 25/0657; H01L 23/3107; H01L 24/46; H01L 24/73; H01L 24/31; H01L 2224/73151; H01L 24/85; H01L 24/92; H01L 24/32; H01L 24/48; H01L 24/83; H01L 2224/92247;
(Continued)

(56) References Cited

U.S. PATENT DOCUMENTS 9,252,200 B2 *  2/2016  Watanabe ............... H01L 28/10
2014/0175602 A1 *  6/2014  Funaya .................. H01L 24/03
257/531

(Continued)

FOREIGN PATENT DOCUMENTS

JP    2015-095469 A    5/2015

*Primary Examiner* — Eduardo A Rodela
(74) *Attorney, Agent, or Firm* — McDermott Will & Emery LLP

(57) ABSTRACT

A first semiconductor chip and a second semiconductor chip are stacked such that a first inductor and a second inductor face each other. An insulating sheet is disposed between the first semiconductor chip and the second semiconductor chip. The sealing member seals the first semiconductor chip, the second semiconductor chip, and the insulating sheet. The sealing member is disposed both between the insulating sheet and the first semiconductor chip and between the insulating sheet and the second semiconductor chip.

6 Claims, 20 Drawing Sheets

(51) Int. Cl.
*H01L 25/065* (2006.01)
*H01L 23/31* (2006.01)
*H01L 23/00* (2006.01)
*H01L 23/64* (2006.01)

(52) U.S. Cl.
CPC .... *H01L 23/49586* (2013.01); *H01L 23/5227* (2013.01); *H01L 23/645* (2013.01); *H01L 24/31* (2013.01); *H01L 24/46* (2013.01); *H01L 24/73* (2013.01); *H01L 25/0657* (2013.01); *H01L 2224/73151* (2013.01)

(58) Field of Classification Search
CPC ... H01L 2224/92147; H01L 2224/2919; H01L 2224/29339; H01L 2224/29199; H01L 2224/291; H01L 2224/32245; H01L 2224/32225; H01L 2224/33181; H01L 2224/48247; H01L 23/16; H01L 23/585
See application file for complete search history.

(56) References Cited

U.S. PATENT DOCUMENTS

| | | | |
|---|---|---|---|
| 2016/0093570 A1* | 3/2016 | Watanabe | H01L 24/48 257/531 |
| 2016/0197066 A1* | 7/2016 | Uchida | H01L 23/5227 438/3 |
| 2018/0277518 A1* | 9/2018 | Iida | H01L 25/50 |
| 2019/0273066 A1* | 9/2019 | Kuwabara | H01L 25/0652 |

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2018-221443 filed on Nov. 27, 2018 including the specification, drawings and abstract is incorporated herein by reference in its entirety.

BACKGROUND

The present disclosures relate to a semiconductor device and method of manufacturing the semiconductor device.

Techniques for non-contact transmission of signal between two semiconductor chips are disclosed, for example, in Japanese Unexamined Patent Application Publication No. 2015-95469 (Patent Document 1).

In Patent Document 1, a first semiconductor chip having a first inductor and a second semiconductor chip having a second inductor are stacked with an insulating film interposed therebetween. The first inductor and the second inductor face each other with the insulating film interposed therebetween. By making the first inductor and the second inductor face each other in this manner, it is possible to transmit a signal between two semiconductor chips in a non-contact manner.

In Patent Document 1, the insulating film is located outside the first semiconductor chip. Therefore, the path from the first semiconductor chip to the second semiconductor chip becomes longer by a length of the top surface, the end surface, and the back surface of the insulating film located outside the first insulating film. Therefore, an occurrence of dielectric breakdown between the first semiconductor chip and the second semiconductor chip is suppressed.

However, in the semiconductor device described in the above-mentioned document 1, it is desired to further increase the dielectric breakdown voltage by further increasing the creeping distances between the upper and lower chips.

Other objects and novel features will become apparent from the description of this specification and the accompanying drawings.

SUMMARY

The semiconductor device according to embodiments includes a first semiconductor chip, a second semiconductor chip, an insulating sheet, and a sealing member. The first semiconductor chip includes a first inductor. The second semiconductor chip includes a second inductor and is stacked on the first semiconductor chip such that the second inductor faces the first inductor. The insulating sheet is disposed between the first semiconductor chip and the second semiconductor chip. The sealing member seals the first semiconductor chip, the second semiconductor chip, and the insulating sheet. The sealing member is disposed both between the insulating sheet and the first semiconductor chip and between the insulating sheet and the second semiconductor chip.

The manufacturing method of the semiconductor device of embodiments includes the following steps. A first semiconductor chip including a first inductor is provided. A second semiconductor chip including a second inductor is provided. The first semiconductor chip and the second semiconductor chip are stacked with an insulating sheet interposed between the first semiconductor chip and the second semiconductor chip such that the first inductor and the second inductor face each other. The first semiconductor chip, the second semiconductor chip, and the insulating sheet are sealed with a sealing member. The sealing member is disposed both between the insulating sheet and the first semiconductor chip and between the insulating sheet and the second semiconductor chip.

According to the above embodiments, it is possible to realize a semiconductor device having a large creeping distance and a high dielectric strength, and a manufacturing method thereof.

DETAILED DESCRIPTION

Figure 1:
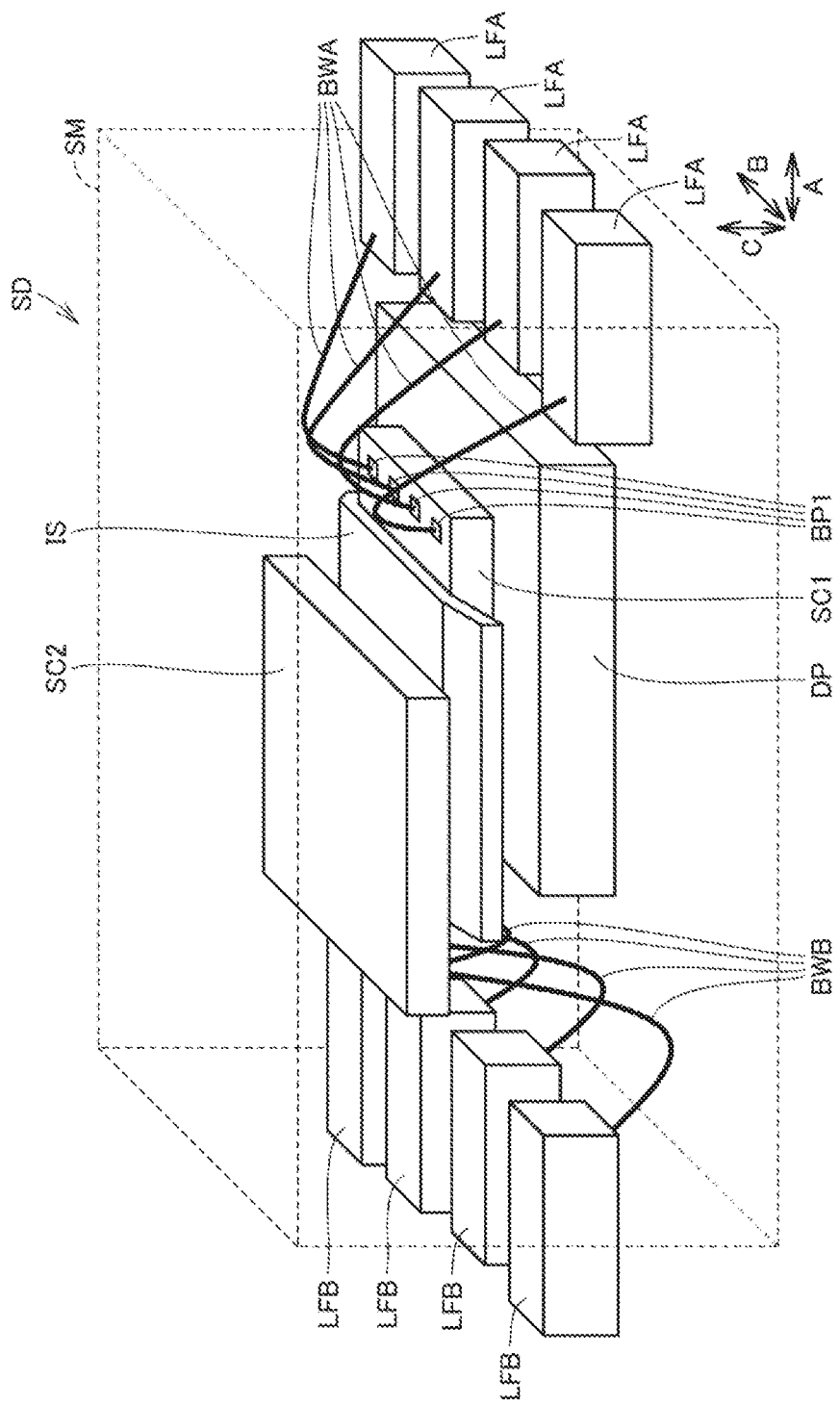
FIG. 1 is a perspective view showing the configuration of the semiconductor device according to a first embodiment perspective of the inside of the sealing member.

Hereinafter, embodiments of the present disclosure will be described in detail with reference to the drawings. In the specification and drawings, the same or corresponding components are denoted by the same reference numerals, and a repetitive description thereof is not repeated. In the drawings, for convenience of description, the configuration may be omitted or simplified. Further, at least a part of each embodiment and each modification may be arbitrarily combined with each other.

First Embodiment

<Configuration of Semiconductor Device>

First, a configuration of a semiconductor device according to the present embodiment will be described with reference to FIGS. 1-6.

As shown in FIG. 1, the semiconductor device SD according to present embodiment is, for example, System In aPackage (SIP) having Face-to-Face (FtF) structure in which two semiconductor chips SC1 and SC2 face each other. The semiconductor device SD are applied to, for example, digital isolator.

The semiconductor device SD includes a die pad DP, a plurality of leads LFA and LFB, a first semiconductor chip SC1, an insulating sheet IS, a second semiconductor chip SC2, a first bonding wire BWA, a second bonding wire BWB, and a sealing member SM.

The first semiconductor chip SC1 is mounted on the die pad DP. A second semiconductor chip SC2 is stacked on the first semiconductor chip SC1. The insulating film IS is disposed between the first semiconductor chip SC1 and the second semiconductor chip SC2.

The first semiconductor chip SC1 includes a plurality of first pad electrodes BP1. Each of a plurality of first pad electrodes BP1 is disposed on a surface of the first semiconductor chip SC1 in the second semiconductor chip SC2 side. The first bonding wire BWA is connected to each of the plurality of first pad electrodes BP1. The first bonding wire BWA is connected to an inner lead of the lead LFA.

The second semiconductor chip SC2 includes a plurality of second pad electrodes (not shown). Each of the plurality of second pad electrodes is disposed on a surface of the second semiconductor chip SC2 in the first semiconductor chip SC1 side. A second bonding wire BWB is connected to each of the plurality of second pad electrodes. The second bonding wire BWB is connected to a part of the lead LFB.

The sealing member SM seals the die pad DP, the first semiconductor chip SC1, the second semiconductor chip SC2, the insulating sheet IS, the first bonding wire BWA, and the second bonding wire BWB. A portion of each of the leads LFA and LFB protrudes from the sealing member SM.

In FIG. 1, the hanging pin (hanging lead) connected to the die pad DP is omitted, but the hanging pin extends, for example, in a direction indicated by an arrow B (hereinafter also referred to as "hanging pin direction B"). Each of the plurality of leads LFA and LFB extends, for example, in a direction indicated by an arrow A (hereinafter, also referred to as a "lead direction A"). The lead direction A is a direction orthogonal to the hanging pin direction B. In other drawings, the hanging pins are not shown.

The direction indicated by the arrow C is orthogonal to both the lead direction A and the hanging pin direction B. The die pad DP, the first semiconductor chip SC1, the insulating sheet IS, and the second semiconductor chip SC2 are stacked in the directions indicated by the arrows C.

Figure 2A:
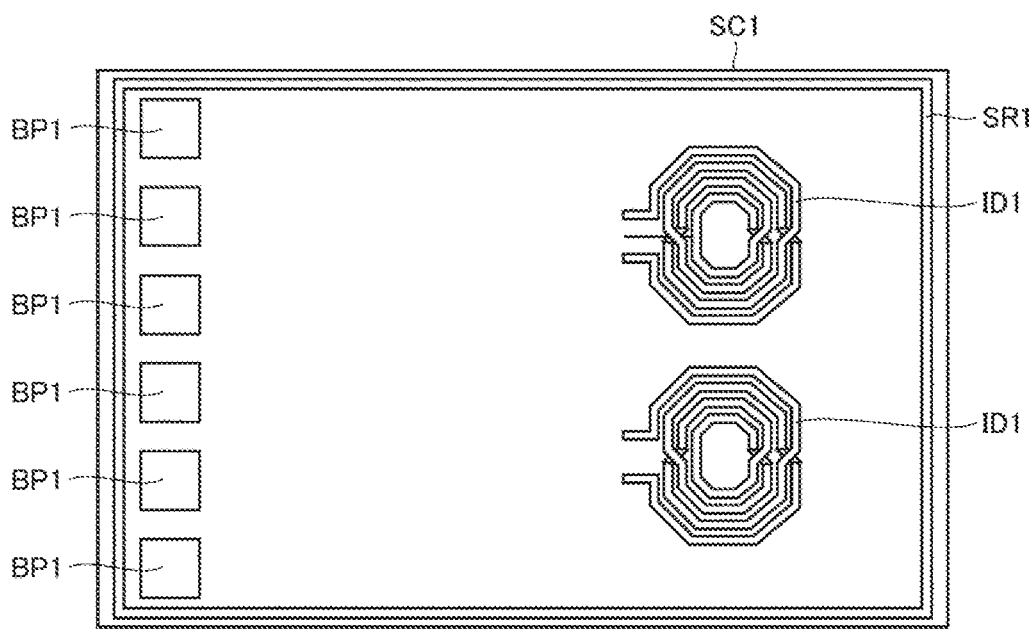
FIG. 2A is a plan view showing the first semiconductor chip included in the semiconductor device of FIG. 1.

As shown in FIG. 2A, the first semiconductor chip SC1 includes a plurality of first inductors ID1, a plurality of first pad electrodes BP1, and a first seal ring SR1. The same layer wiring as the pad electrodes on the other pad electrodes is omitted. The first semiconductor chip SC1 has a rectangular planar shape.

The plurality of first inductors ID1 have two inductor ID1. The two inductors ID1 are, for example, an inductor ID1 for receiving and an inductor ID1 for transmitting. Each of the plurality of first inductors ID1 is, for example, a primary-side inductor.

The plurality of first pad electrodes BP1 are arranged side by side along one side of a rectangular outer edge of the first semiconductor chip SC1 in plan view. The first sealing ring SR1 surrounds the plurality of first inductors ID1 and the plurality of first pad electrodes BP1 in plan view. The first sealing ring SR1 has a frame shape along a rectangular outer edge of the first semiconductor chip SC1.

Figure 2B:
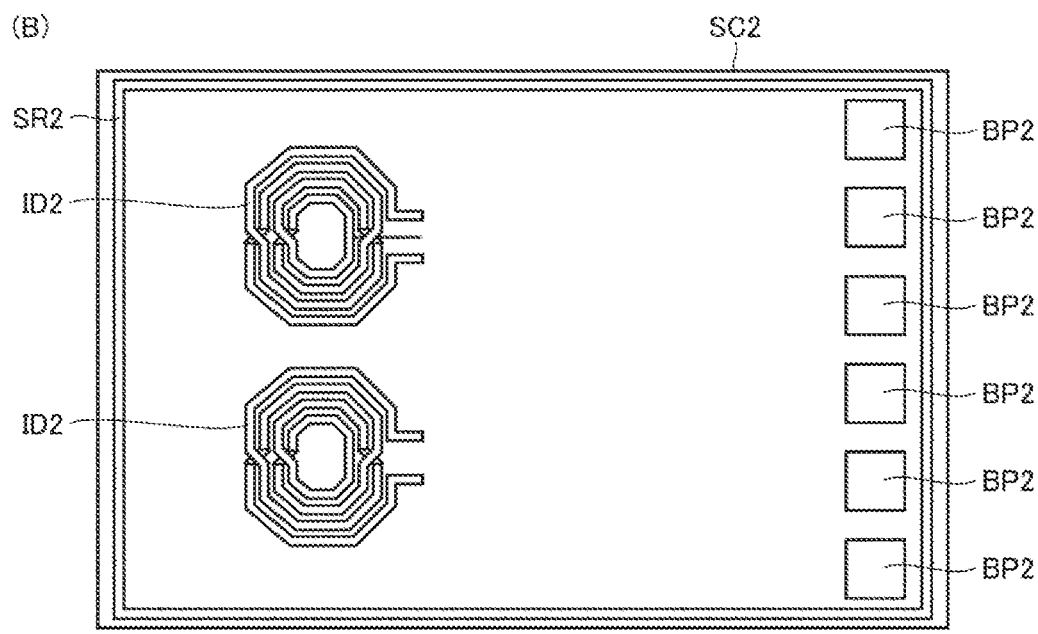
FIG. 2B is a plan view showing the second semiconductor chip.

As shown in FIG. 2B, the second semiconductor chip SC2 includes a plurality of second inductors ID2, a plurality of second pad electrodes BP2, and a second seal ring SR2. The second semiconductor chip SC2 has a rectangular planar shape.

The plurality of second inductors ID2 have two inductor ID2. The two inductors ID2 are, for example, an inductor ID2 for receiving and an inductor ID2 for transmitting. Each of the plurality of second inductors ID2 is, for example, a secondary inductor.

The plurality of second pad electrodes BP2 are arranged side by side along one side of the rectangular outer edge of the second semiconductor chip SC2 in plan view. The second sealing ring SR2 surrounds the plurality of second inductors ID2 and the plurality of second pad electrodes BP2 in plan view. The second sealing ring SR2 has a frame shape along a rectangular outer edge of the second semiconductor chip SC2.

Figure 3:
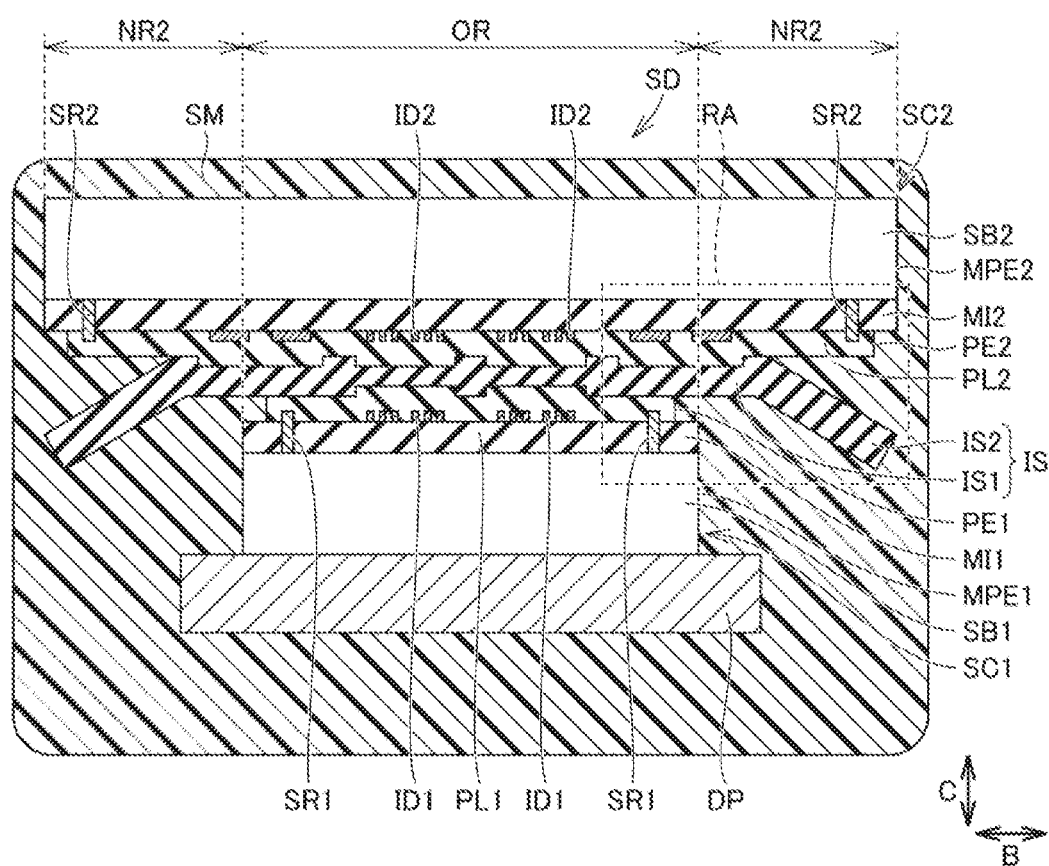
FIG. 3 is a cross-sectional view cut in a direction of hanging pins, showing the configuration of the semiconductor device according to the first embodiment.

As shown in FIG. 3, the first semiconductor chip SC1 includes a first semiconductor substrate SB1, a first multi-layer wiring structural MI1, a first inductor ID1, a first sealing ring SR1, and a first passivation layer PL1.

Figure 4:
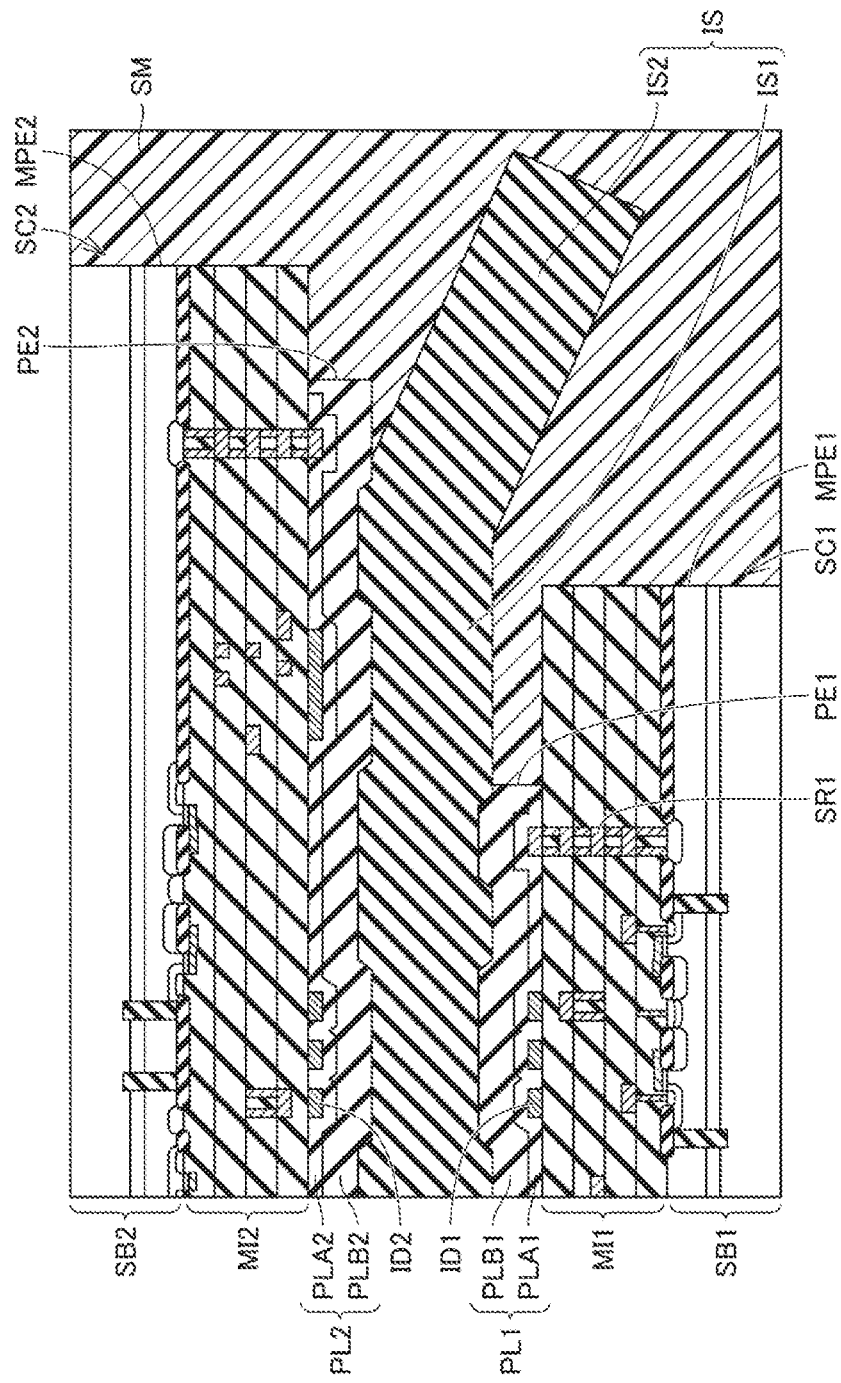
FIG. 4 is an enlarged cross-sectional view shown of an area RA in FIG. 3.

As shown in FIG. 4, the first semiconductor substrate SB1 is, for example, Silicon On Insulator (SOI) substrate, but may be monocrystalline silicon substrate. A Metal Oxide Semiconductor (MOS) transistor, a Double Diffusion MOS (DMOS) transistor, and the like are disposed on the first semiconductor substrate SB1.

The first multilayered wiring structural MI1 has a structure in which a wiring layer and an interlayer insulating layer are alternately stacked a plurality of times. The wiring layers of the first multi-layer wiring structures are electrically connected to MOS transistors or the like disposed on the surfaces of the first semiconductor substrate SB1. The interlayer insulating layer in the first multilayer wiring structural MI1 electrically separates the underlying wiring layer from the upper layer wiring layer. The wiring layer of the lower layer and the wiring layer of the upper layer are appropriately electrically connected to each other through a via plug.

The first seal ring SR1 has a multilayered seal ring conductive layer and a via plug for connecting the upper and lower seal ring conductive layers. The multi-layer seal ring conductive layer includes a multi-layer seal ring conductive layer included in the first multi-layer wiring structure MI1, and a top seal ring conductive layer disposed on the top interlayer insulating layer in the first multi-layer wiring structure MI1.

The first inductor ID1 is disposed on the uppermost interlayer insulating layer in the first multilayered wiring structural MI1.

A first passivation layer PL1 is disposed over the first multi-layer wiring structural MI1. The first passivation layer PL1 covers the first inductor ID1 and the conductive layer for the uppermost seal ring in the first seal ring SR1.

The first passivation layer PL1 has, for example, two insulating layers PLA1 and PLB1. The insulating layer PLA1 is formed of, for example, silicon nitride, and the insulating layer PLB1 is formed of, for example, polyimide. The insulating layer PLB1 is disposed on the insulating layer PLA1.

The first outer peripheral edge PE1 of the first passivation layer PL1 is located inside the first semiconductor chip SC1 from the first outermost peripheral edge MPE1 of the first semiconductor chip SC1. Therefore, the outer peripheral region of the uppermost interlayer insulating layer in the first multilayered wiring structural MI1 is not covered with the first passivation layer PL1.

As shown in FIG. 3, the second semiconductor chip SC2 includes a second semiconductor substrate SB2, a second multilayered wiring structure MI2, a second inductor ID2, a second sealing ring SR2, and a second passivation layer PL2 (second protective layer).

As shown in FIG. 4, the second semiconductor substrate SB2 is, for example, SOI substrate, but may also be monocrystalline silicon substrate. A MOS transistor, a DMOS transistor, and the like are disposed on the second semiconductor substrate SB2.

The second multilayered wiring structural MI2 has a structure in which a wiring layer and an interlayer insulating layer are alternately stacked a plurality of times. The wiring layers of the second multi-layer wiring structures are electrically connected to MOS transistors or the like disposed on the second semiconductor substrate SB2. The interlayer insulating layer in the second multilayer wiring structural MI2 electrically separates the underlying wiring layer from the upper layer wiring layer. The wiring layer of the lower layer and the wiring layer of the upper layer are appropriately electrically connected to each other through a via plug.

The second seal ring SR2 has a multilayered seal ring conductive layer and a via plug for connecting the upper and lower seal ring conductive layers. The multi-layer seal ring conductive layer includes a multi-layer seal ring conductive layer included in the second multi-layer wiring structure MI2, and a top seal ring conductive layer disposed on the top interlayer insulating layer of the second multi-layer wiring structure MI2.

The second inductor ID2 is disposed on the uppermost interlayer insulating layer in the second multi-layer wiring structural MI2.

The second passivation layer PL2 is arranged on the second multilayered wiring structural MI2. The second passivation layer PL2 covers the second inductor ID2 and the conductive layer for the uppermost seal ring in the second seal ring SR2.

The second passivation layer PL2 has, for example, two insulating layers PLA2 and PLB2. The insulating layer PLA2 is formed of, for example, silicon nitride, and the insulating layer PLB2 is formed of, for example, polyimide. The insulating layer PLB2 is disposed on the insulating layer PLA2.

The outer peripheral edge PE2 of the second passivation layer PL2 is located inside the second semiconductor chip SC2 from the second outermost peripheral edge MPE2 of the second semiconductor chip SC2. Therefore, the outer peripheral region of the uppermost interlayer insulating layer in the second multilayered wiring structural MI2 is not covered with the second passivation layer PL2.

As shown in FIG. 3, when the first semiconductor chip SC1 and the second semiconductor chip SC2 are stacked, the first inductor ID1 and the second inductor ID2 face each other with at least the insulating sheet IS interposed therebetween. This enables signals to be transmitted between the first inductor ID1 and the second inductor ID2 in a non-contact manner. The first inductor ID1 and the second inductor ID2 constitute, for example, a digital isolator.

The sealing member SM is disposed between the insulating sheet IS and the first semiconductor chip SC1 and between the insulating sheet IS and the second semiconductor chip SC2. The sealing member SM is formed of resin, for example.

As shown in FIG. 4, the sealing member SM contacts with each of the upper surface of the uppermost interlayer insulating layer of the first multilayer wiring structural MI1, the outer peripheral edge PE1 of the first passivation layer PL1, and the surface of the insulating sheet IS on the SC1 side of the first semiconductor chip.

The sealing member SM contacts with each of the surface of the uppermost interlayer insulating layer of the second multilayer wiring structural MI2, the outer peripheral edge PE2 of the second passivation layer PL2, and the surface of the insulating sheet IS facing the first semiconductor chip SC1.

As shown in FIG. 3, in the cross section along the hanging pin direction B, the second semiconductor chip SC2 has a region OR facing the first semiconductor chip SC1 and a region NR2 not facing the first semiconductor chip SC1. In the cross section along the hanging pin direction B, the second semiconductor chip SC2 extends longer on both sides along the hanging pin direction B than the first semiconductor chip SC1. Therefore, the region NR2 where the second semiconductor chip SC2 does not face the first semiconductor chip SC1 is located on both sides of the region OR where the second semiconductor chip SC2 faces the first semiconductor chip SC1.

In the cross section along the hanging pin direction B, the sealing member SM is disposed between the first semiconductor chip SC1 and the insulating sheet IS in the region OR in which the first semiconductor chip SC1 and the second semiconductor chip SC2 face each other. In the cross section along the hanging pin direction B, the sealing member SM is disposed between the second semiconductor chip SC2 and the insulating sheet IS in the region NR2 where the first semiconductor chip SC1 and the second semiconductor chip SC2 do not face each other.

In the cross-section along the hanging pin direction B, the sealing member SM may be disposed between the second semiconductor chip SC2 and the insulating sheet IS in the region OR, and the sealing member SM may be disposed between the second semiconductor chip COB and the insulating sheet IS in the region OR.

The insulating sheets IS have a first portion IS 1 and a second portion IS 2. The first portion IS1 is a portion that extends linearly while contacting each of the surface of the first semiconductor chip SC1 and the surface of the second semiconductor chip SC2. The first portion IS1 is located at least in the region OR.

The second portion IS2 is connected to the outer peripheral edge of the first portion IS1 and extends further outward from the outer peripheral edge of the first portion IS1. The second portion IS2 is bent away from the surface of the second semiconductor chip SC2 with respect to the surface of the first portion IS1. As a result, the second portion IS2 is inclined with respect to the first portion IS1.

The second portion IS 2 extends so as not to contact the surface of the first semiconductor chip SC1 and the surface of each of the second semiconductor chips SC2. The second portion IS2 extends, for example, linearly. The second portion IS2 is located in an area NR2 where the first semiconductor chip SC1 and the second semiconductor chip SC2 do not face each other.

The sealing member SM contacts with both the surface of the second portion IS2 on the first semiconductor chip SC1 side and the surface of the second portion IS2 on the second semiconductor chip SC2 side. The sealing member SM is also in contact with the outer peripheral edge of the second portion IS2.

In the cross section along the hanging pin direction B, the insulating sheet IS extends outward from at least one of the first outermost peripheral edge MPE1 of the first semiconductor chip SC1 and the second outermost peripheral edge MPE2 of the second semiconductor chip SC2. Here, the outer side means the side opposed to the central side of the first semiconductor chip SC1 in the hanging pin direction B.

Figure 5:
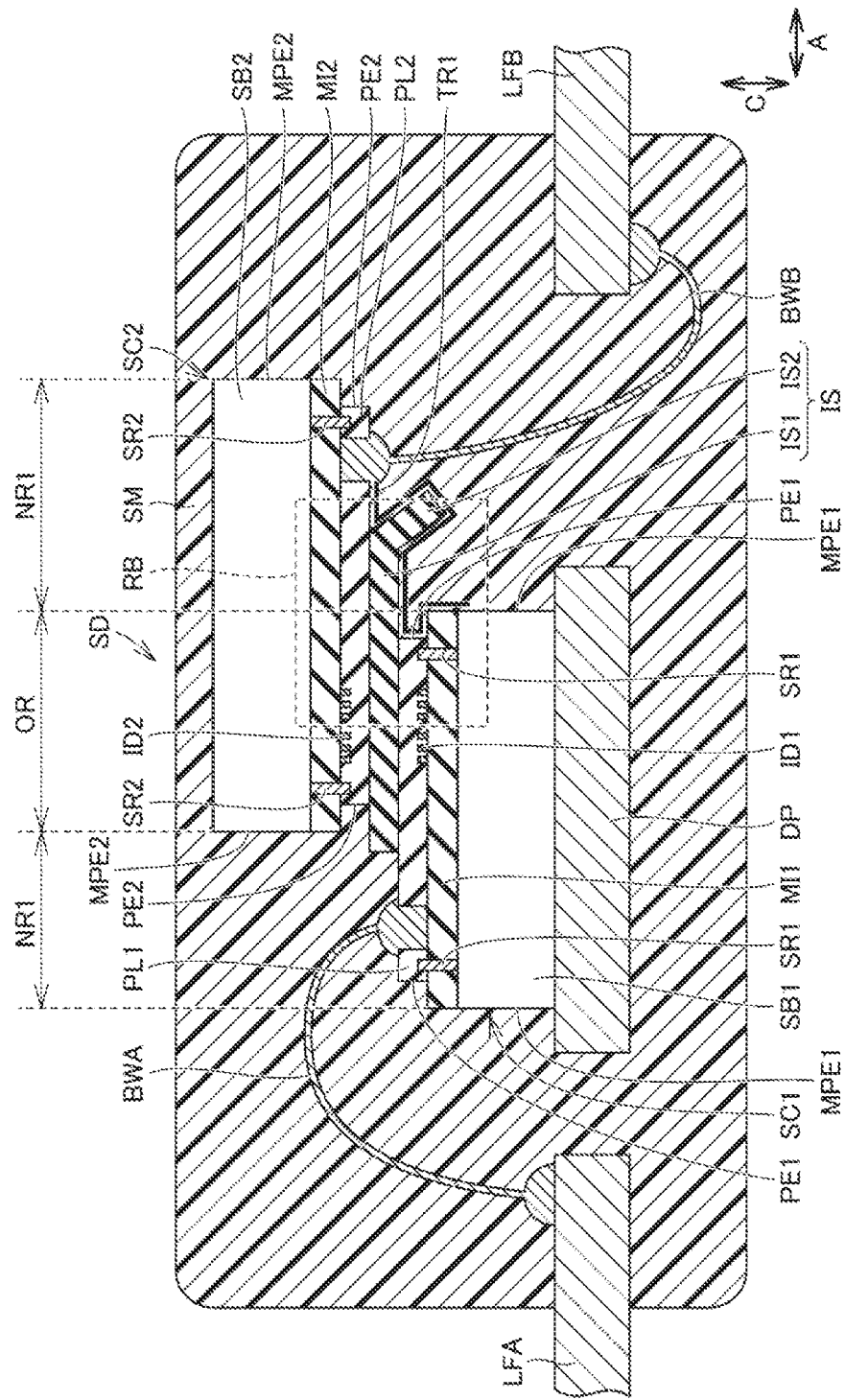
FIG. 5 is across-sectional view cut in a lead direction, showing the configuration of the semiconductor device according to the first embodiment.
Figure 6:
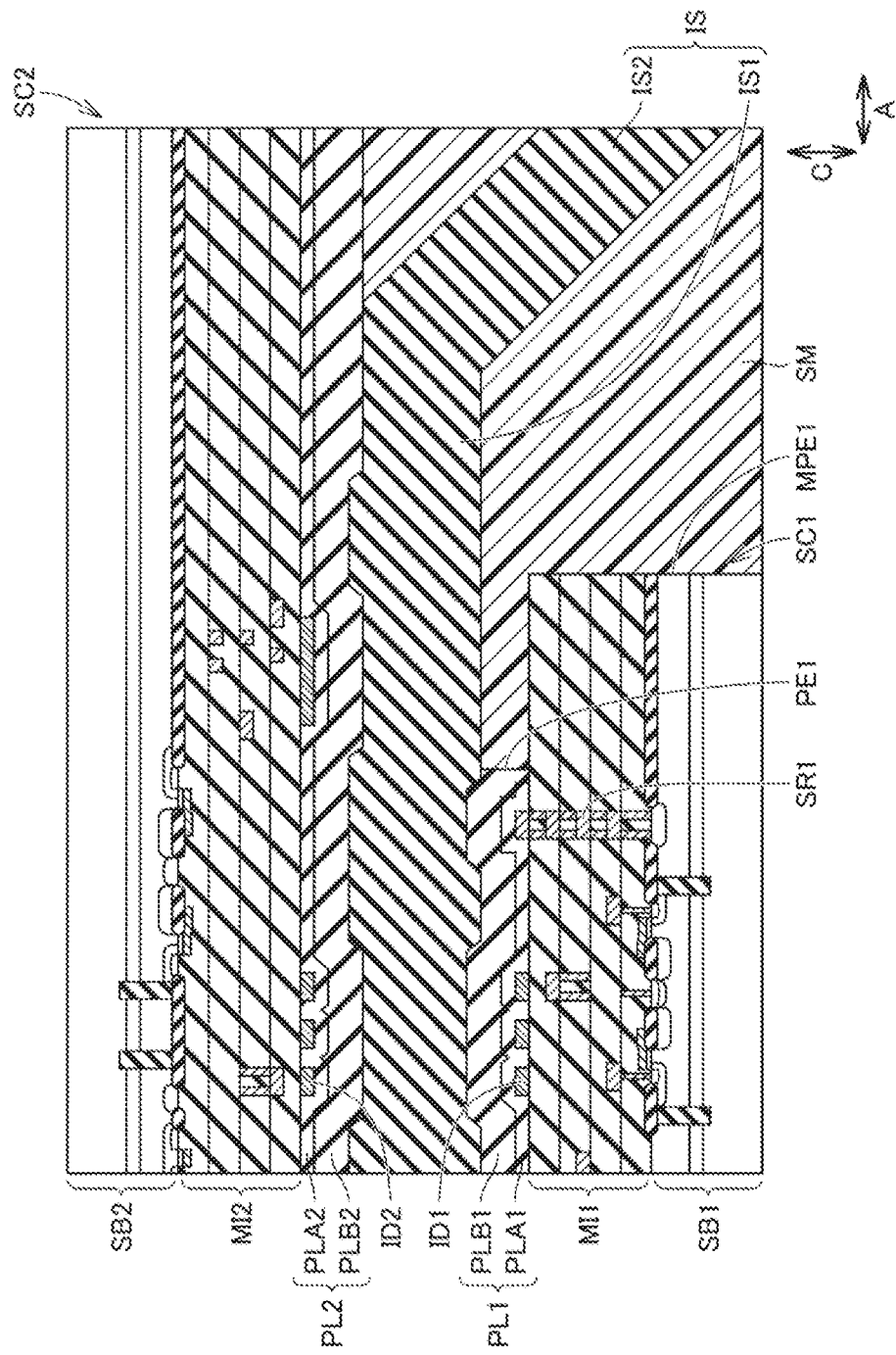
FIG. 6 is an enlarged cross-sectional view showing an area RB of FIG. 5.

As shown in FIGS. 5 and 6, in the cross section along the lead direction A, the first semiconductor chip SC1 and the second semiconductor chip SC2 are arranged so as to be shifted from each other in the lead direction A. In the cross section along the lead direction A, the second semiconductor chip SC2 has a region OR facing the first semiconductor chip SC1 and a region NR1 not facing the first semiconductor chip SC1. The first semiconductor chip SC1 has a region OR facing the second semiconductor chip SC2 and a region NR1 not facing the second semiconductor chip SC2.

In the cross section along the lead direction A, the sealing member SM is disposed between the first semiconductor chip SC1 and the insulating sheet IS and between the second semiconductor chip SC2 and the insulating sheet IS in the region OR.

In the cross section along the lead direction A, the sealing member SM is disposed between the second semiconductor chip SC2 and the insulating sheet IS in the region NR2 where the second semiconductor chip SC2 does not face the first semiconductor chip SC1.

In the region NR2, the second portion IS2 is bent away from the surface of the second semiconductor chip SC2 with respect to the first portion IS1. As a result, the second portion IS2 is inclined with respect to the first portion IS1.

In the area NR1 where the first semiconductor chip SC1 does not face the second semiconductor chip SC2, the insulating sheet IS does not have a bent portion with respect to the first portion sheet IS1. However, the insulating sheet IS may have a second portion in which the insulating sheet IS is bent away from the surface of the first semiconductor chip SC1 with respect to the first portion IS1 in the area NR1 where the first semiconductor chip SC1 does not face the second semiconductor chip SC2.

The second portion IS2 does not contact the surface of the first semiconductor chip SC1 and the surface of the second semiconductor chip SC2, but extends, for example, linearly.

The sealing member SM contacts with both the surface of the second portion IS2 on the first semiconductor chip SC1 side and the surface of the second portion IS2 on the second semiconductor chip SC2 side. The sealing member SM also contacts with the outer peripheral edge of the second portion IS2.

Next, a method of manufacturing the semiconductor device of the present embodiment will be described with reference to FIGS. 7 to 12 in the cross section along the hanging pin direction B shown in FIG. 3.

Figure 7:
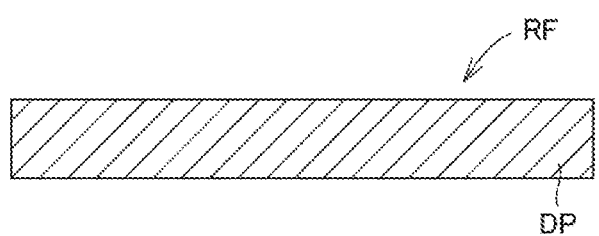
FIG. 7 is a cross-sectional view cut in the direction of hanging pins, showing a first step of method of manufacturing a semiconductor device according to the first embodiment.

As shown in FIG. 7, a leadframe RF is provided. The lead frame RF includes a die pad DP, a plurality of leads (not shown), and a suspending pin (not shown).

Figure 8:
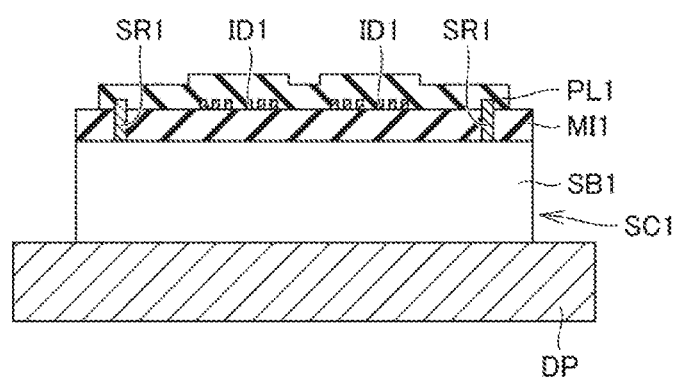
FIG. 8 is a cross-sectional view cut in a suspension pin direction, showing a second step of method of manufacturing the semiconductor device according to the first embodiment.

As shown in FIG. 8, the first semiconductor chip SC1 is provided to have a first semiconductor substrate SB1, a first multi-layer wiring structure MI1, a first inductor ID1, and a first passivation layer PL1.

The first semiconductor chip SC1 is disposed on the die pad DP. The first semiconductor chip SC1 is fixed to the die pad DP by using a silver paste, a Die Attach Film, a metallic alloy, or the like.

Figure 9:
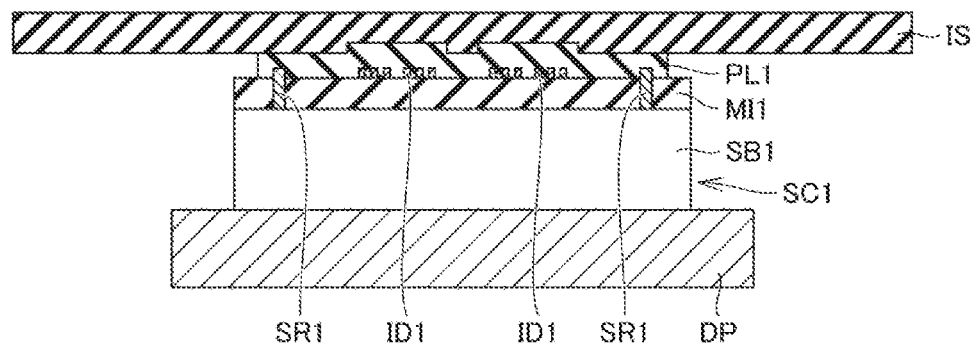
FIG. 9 is a cross-sectional view cut in the suspension pin direction, showing a third step of the method of manufacturing the semiconductor device according to the first embodiment.

As shown in FIG. 9, insulating sheets IS are disposed on the first semiconductor chip SC1. The insulating sheet IS1 is bonded to the first semiconductor chip SC1 by, for example, an adhesive layer (not shown).

Figure 10:
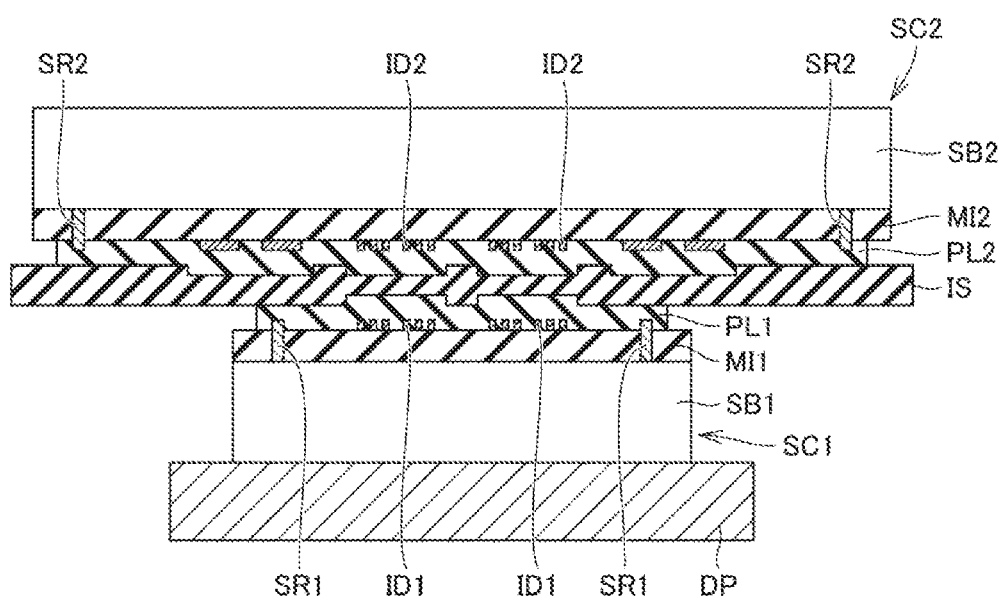
FIG. 10 is a cross-sectional view cut in the suspension pin direction, showing the fourth step of the method of manufacturing the semiconductor device according to the first embodiment.

As shown in FIG. 10, the second semiconductor chip SC2 is provided to have a second semiconductor substrate SB2, a second multi-layer wiring structure MI2, a second inductor ID2, and a second passivation layer PL2.

The second semiconductor chip SC2 is disposed on the insulating sheet IS. The second semiconductor chip SC2 is bonded to the insulating sheet IS by, for example, an adhesive layer (not shown).

Figure 11:
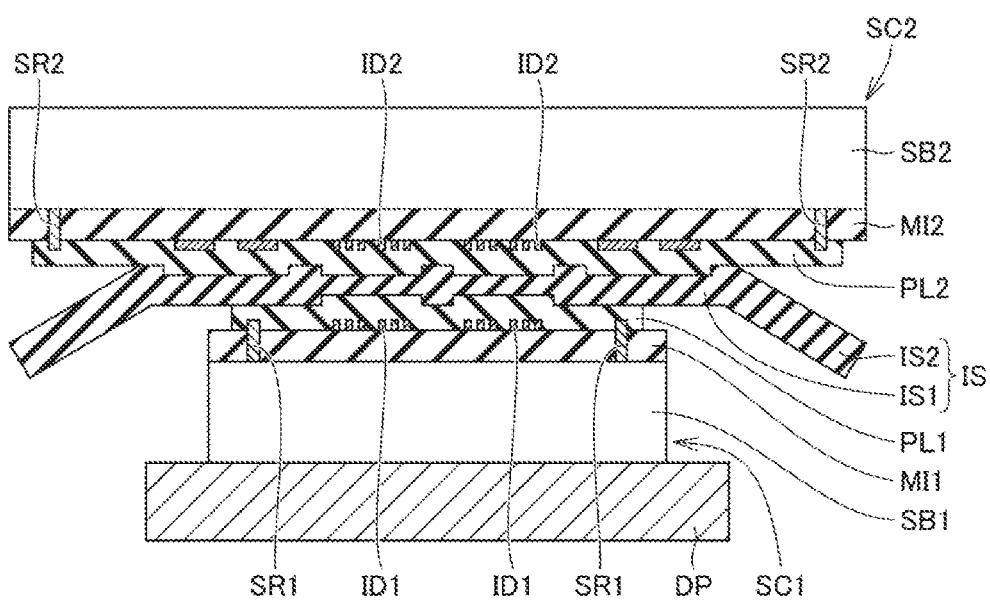
FIG. 11 is a cross-sectional view cut in the suspension pin direction, showing a fifth step of the method of manufacturing the semiconductor device according to the first embodiment.

As shown in FIG. 11, the insulating sheet IS is cured by heating. The insulating sheet IS is bent at the time of curing or due to its own weight.

Figure 12:
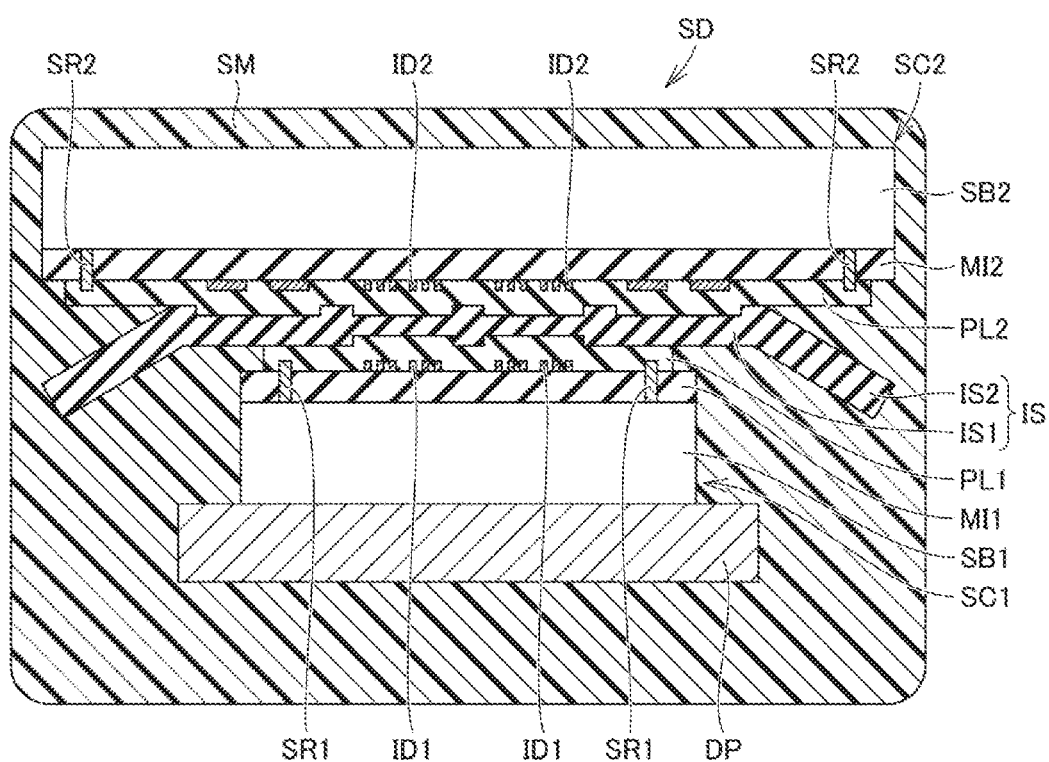
FIG. 12 is a cross-sectional view cut in the suspension pin direction, showing a sixth step of the method of manufacturing the semiconductor device according to the first embodiment.

As shown in FIG. 12, wire bonding is performed. As a result, the first pad electrodes of the first semiconductor chip SC1 and the first leads of the first semiconductor chip OOB are connected to each other by the first bonding wires. The second pad electrodes of the second semiconductor chip SC2 and the second leads of the second semiconductor chip COB are connected to each other by a second bonding wire.

Thereafter, the die pad DP, the first semiconductor chip SC1, the second semiconductor chip SC2, the insulating sheet IS, the first bonding wire and the second bonding wire are sealed with the sealing member SM. A portion of each of the plurality of leads protrudes from the sealing member SM.

The sealing member SM is disposed both between the insulating sheet IS and the first semiconductor chip SC1 and between the insulating sheet IS and the second semiconductor chip SC2.

The sealing member SM contacts with each of the upper surface of the uppermost interlayer insulating layer of the first multilayer wiring structural MI1 in the first semiconductor chip SC1, the outer peripheral edge PE1 of the first passivation layer PL1, and the top surface of the insulating sheet IS in the first semiconductor chip SC1 side.

The sealing member SM contacts with each of the upper surface of the uppermost interlayer insulating layer of the second multilayer wiring structural MI2, the outer peripheral edge PE2 of the second passivation layer PL2, and the top surface of the insulating sheet IS facing the first semiconductor chip SC1.

Thereafter, the semiconductor device SD of the present embodiment are completed through a typical semiconductor-package assembling process.

Next, the action and effect of present embodiment will be explained in comparison with the comparative examples shown in FIG. 13.

Figure 13:
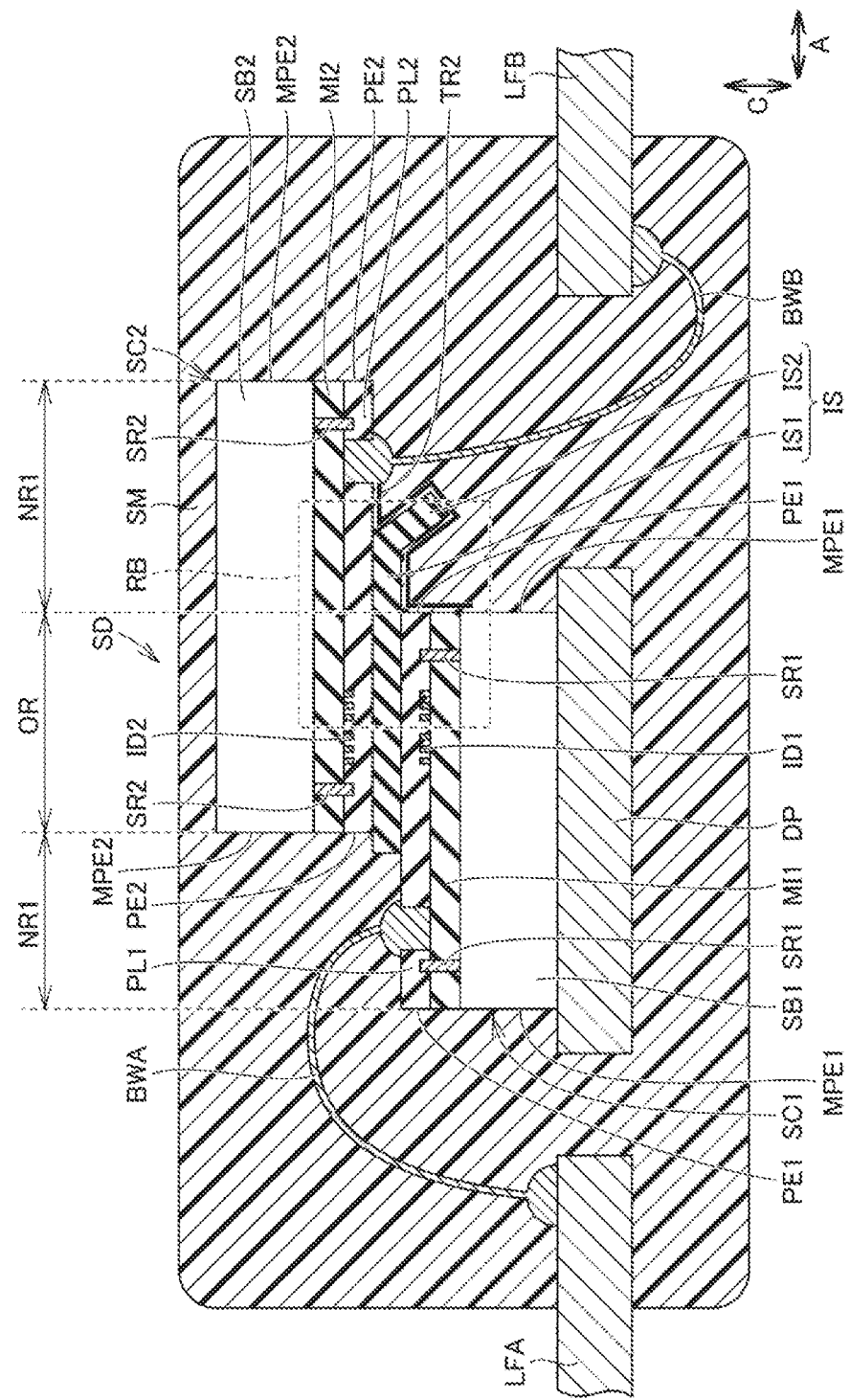
FIG. 13 is a cross-sectional view cut in the lead direction, showing the configuration of the semiconductor device according to a comparative example.

As shown in FIG. 13, in the comparative embodiment, the outer peripheral edge PE1 of the first passivation layer PL1 constitutes a surface that is contiguous with the first outermost peripheral edge MPE1 of the first semiconductor chip SC1. Therefore, the creeping distance between the second bonding wire BWB and the first semiconductor substrate SB1 in the comparative embodiment is the distance in the path TR2 indicated by the thick line. Therefore, in the comparative embodiment, a route for forming creeping distances is not formed in the region OR in which the first semiconductor chip SC1 and the second semiconductor chip SC2 face each other.

On the other hand, in present embodiment, as shown in FIG. 5, the sealing member SM is disposed between the insulating sheet IS and the first semiconductor chip SC1 and between the insulating sheet IS and the second semiconductor chip SC2. Therefore, the creeping distance between the second bonding wire BWB and the first semiconductor substrate SB1 in the present embodiment is the distance in the path TR1 indicated by the thick line. In the present embodiment, the creeping distances are also formed in the regions OR where the first semiconductor chip SC1 and the second semiconductor chip SC2 face each other. Therefore, the creeping distance can be made larger than that of the comparative example. Since the creeping distance of the interface is increased, the withstand voltage of the digital isolator can be improved, and the time to the failure can be prolonged.

In present embodiment, as shown in FIGS. 3 to 6, the first outer peripheral edge PE1 of the first passivation layer PL1 is located inside the first outermost peripheral edge MPE1 of the first semiconductor chip SC1. The second outer peripheral edge PE2 of the second passivation layer PL2 is located inside the second outermost peripheral edge MPE2 of the second semiconductor chip SC2. This facilitates disposing the sealing member SM between the insulating sheet IS and the first semiconductor chip SC1 and between the insulating sheet IS and the second semiconductor chip SC2.

In present embodiment, as shown in FIG. 3, the insulating sheet IS extends outward from at least one of the first outermost peripheral edge MPE1 of the first semiconductor chip SC1 and the second outermost peripheral edge MPE2 of the second semiconductor chip SC2. Since the insulating sheet IS extends outward in this manner, it is possible to secure a larger creeping distance.

In present embodiment, as shown in FIG. 3, the insulating sheet IS has a first portion IS1 positioned between the first semiconductor chip SC1 and the second semiconductor chip SC2, and a second portion IS2 bent with respect to the first portion IS1. The sealing member SM is in contact with both the surface of the second portion IS2 on the first semiconductor chip SC1 side and the surface of the second portion IS2 on the second semiconductor chip SC2 side. This makes it possible to secure a larger creeping distance.

Second Embodiment

Figure 14:
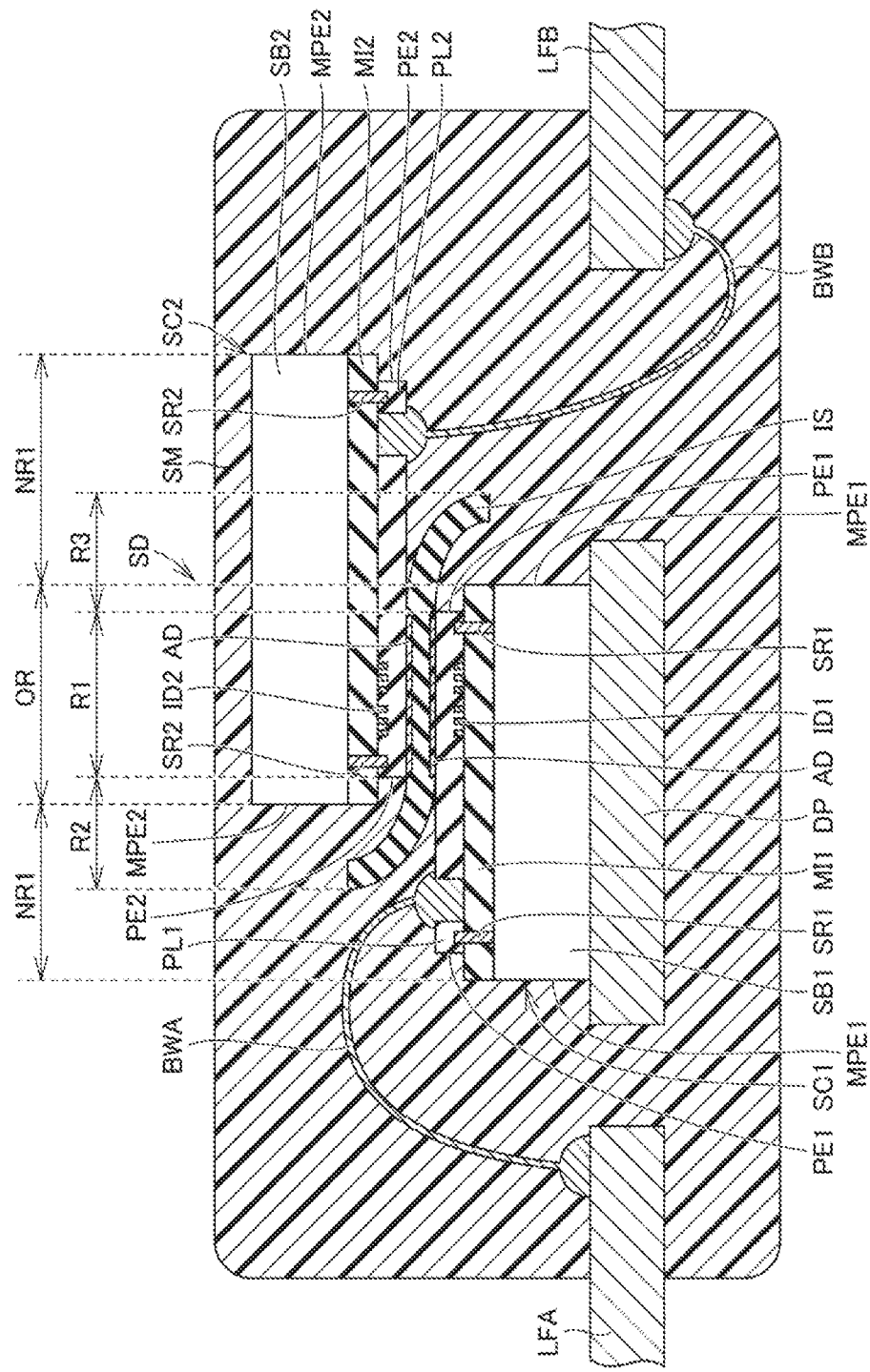
FIG. 14 is a cross-sectional view cut in the lead direction, showing a configuration of a semiconductor device according to second embodiment.
Figure 15:
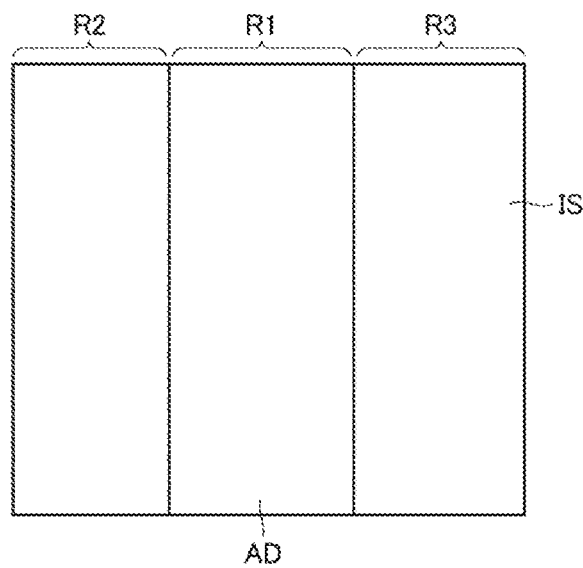
FIG. 15 is a plan view showing the configuration of an insulating sheet included in the semiconductor device of FIG. 14.

As shown in FIG. 14 and FIG. 15, the surface of the insulating sheet IS in the present embodiment has two types of surfaces, i.e., a bondable region R1 and non-bondable regions R2 and R3. The bondable area R1 is disposed only at a portion of the insulating sheet IS to be bonded to the first semiconductor chip SC1 and a portion of the insulating sheet IS to be bonded to the second semiconductor chip SC2. The non-adherable regions R2 and R3 are disposed in the insulating sheet IS at the portions of the insulating sheet IS not desired to be adhered to the first semiconductor chip SC1 and the portions of the insulating sheet IS not desired to be adhered to the second semiconductor chip SC2.

More specifically, the insulating sheet IS has an adherable region R1 in an opposing region OR in which the first semiconductor chip SC1 and the second semiconductor chip SC2 oppose each other. The bondable area R1 is provided in both the first semiconductor chip SC1 side and the second semiconductor chip SC2 side. The insulating sheet IS has non-adherable regions R2 and R3 outside the opposing region OR. The non-adhesive regions R2 and R3 are also disposed on both the first semiconductor chip SC1 side and the second semiconductor chip SC2 side.

More specifically, the bondable region R1 is disposed in a region where the first passivation layer PL1 (first protective layer) of the first semiconductor chip SC1 and the second passivation layer PL2 (second protective layer) of the second semiconductor chip SC2 face each other. The non-adherable regions R2 and R3 are disposed outside the regions where the first passivation layer PL1 and the second passivation layer PL2 face each other.

The adhesive layer AD is provided on the insulating sheet IS in the bondable region R1, and the adhesive layer AD is not provided on the insulating sheet IS in the non-bondable regions R2 and R3.

In the above present embodiment, the sealing member SM is disposed between the insulating sheet IS and the first semiconductor chip SC1 in the non-adherable regions R2 and R3, and between the insulating sheet IS and the second semiconductor chip SC2 in the non-adherable regions R2 and R3.

Specifically, the sealing member SM is disposed between the insulating sheet IS and the first semiconductor chip SC1 and between the insulating sheet IS and the second semiconductor chip SC2 from the outer peripheral end of the insulating sheet IS to the region where the first passivation layer PL1 and the second passivation layer PL2 face each other.

Note that the configuration and manufacturing method of the semiconductor device other than the above in present embodiment are substantially the same as the configuration and manufacturing method in first embodiment, and therefore descriptions thereof will not be repeated.

In the present embodiment, non-adherable regions R2 and R3 are provided in the insulating sheet IS. As a result, the non-adherable regions R2 and R3 of the insulating sheet IS are not adhered to the first semiconductor chip SC1 and the second semiconductor chip SC2, and the insulating sheet IS is freely adhered to the first semiconductor chip SC1 and the second semiconductor chip CCC. Therefore, when sealing with the sealing member SM, the sealing member SM can be disposed between the insulating sheet IS and the first semiconductor chip SC1 and between the insulating sheet IS and the second semiconductor chip SC2. As a result, the creeping distance can be increased, so that the withstand voltage of the digital isolator can be improved and the time until the failure can be prolonged.

In present embodiment, the bondable region R1 is disposed only in a region where the first passivation layer PL1 and the second passivation layer PL2 face each other.

Therefore, the sealing member SM is disposed between the insulating sheet IS and the first semiconductor chip SC1 and between the insulating sheet IS and the second semiconductor chip SC2 from the outer peripheral end of the insulating sheet IS to the region where the first passivation layer PL1 and the second passivation layer PL2 face each other. Therefore, the creeping distance larger than the creeping distance first embodiment can be secured.

Third Embodiment

Figure 17:
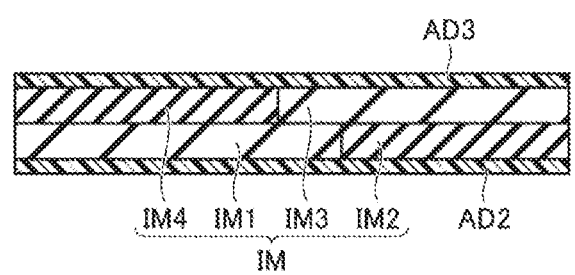
FIG. 17 is a cross-sectional view showing the configuration of the insulating sheet included in the semiconductor device of FIG. 16.

As shown in FIG. 17, the insulating sheet IS of the present embodiment has first portions IM1 and IM3, and second portions IM2 and IM4. The second portions IM2 and IM4 are formed of materials different from those of the first portions IM1 and IM3.

The thermal expansion coefficient of first portions IM1 and IM3 and the thermal expansion coefficient of second portions IM2 and IM4 are different from each other. Specifically, the thermal expansion coefficient of the first portion IM1 and the IM3 are greater than the thermal expansion coefficient of the second portion IM2 and the IM4, for example.

An adhesive layer AD2 is disposed on one surface of the insulating sheet IS, and an adhesive layer AD3 is disposed on the other surface of the insulating sheet IS. The adhesive layer AD2 is disposed on the entire surface of one surface of the insulating sheet IS, and the adhesive layer AD3 is disposed on the entire surface of the other surface of the insulating sheet IS.

As in second embodiment, the adhesive layer AD2 may be selectively disposed on only a part of one surface of the insulating sheet IS, and the adhesive layer AD3 may be selectively disposed on only a part of the other surface of the insulating sheet IS.

Figure 16:
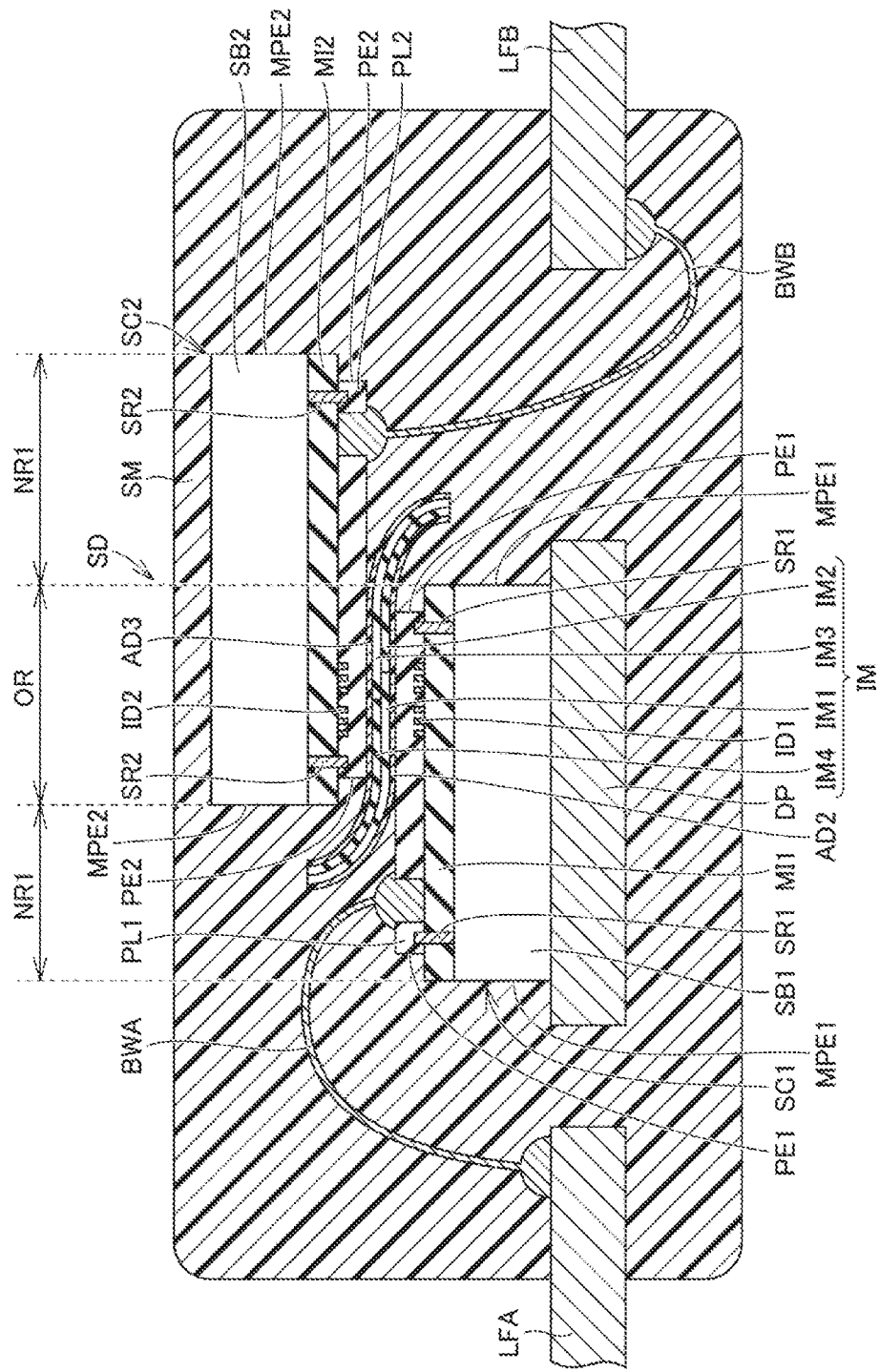
FIG. 16 is a cross-sectional view cut in the lead direction, showing the configuration of a semiconductor device according to a third embodiment.

As shown in FIG. 16, in the region NR1 in which the second semiconductor chip SC2 is not present in the opposite region of the first semiconductor chip SC1, the first portion IM1 is disposed in the first semiconductor chip SC1 side, and the second portion IM2 is disposed in the second semiconductor chip SC2 side. In the region NR1 where the first semiconductor chip SC1 does not exist in the opposite region of the second semiconductor chip SC2, the first portion IM3 is disposed in the second semiconductor chip SC2 side, and the second portion IM4 is disposed in the first semiconductor chip SC1 side.

The insulating sheet IS curves away from the first semiconductor chip SC1 toward the front end of the insulating sheet IS in the region NR1 where the second semiconductor chip SC2 does not exist in the opposite region of the first semiconductor chip SC1. The insulating sheet IS curves away from the second semiconductor chip SC2 toward the front end of the insulating sheet IS in the region NR1 where the first semiconductor chip SC1 does not exist in the opposite region of the second semiconductor chip SC2.

The adhesive layer AD2 bonds the insulating layer IS and the first semiconductor chip SC1 to each other. The adhesive layer AD3 bonds the insulating layer IS and the second semiconductor chip SC2 to each other.

Manufacturing method in present embodiment includes the same steps as manufacturing method in first embodiment. In the step shown in FIG. 11, heat is applied to the insulating sheet IS to fix the insulating sheet IS. This heating distorts the insulating sheet IS. For example, the first portion IM1 and IM3 having a large thermal expansion coefficient expand more than second portions IM2 and IM4 having a small thermal expansion coefficient.

As a result, the insulating sheet IS curves away from the first semiconductor chip SC1 toward the leading end of the insulating sheet IS in the region NR1 where the second semiconductor chip SC2 does not exist in the opposite region of the first semiconductor chip SC1. The insulating sheet IS curves away from the second semiconductor chip SC2 toward the front end of the insulating sheet IS in the region NR1 where the first semiconductor chip SC1 does not exist in the opposite region of the second semiconductor chip SC2.

Note that the configuration and manufacturing method of the semiconductor device other than the above in present embodiment are substantially the same as the configuration and manufacturing method in first embodiment, and therefore descriptions thereof will not be repeated.

In present embodiment, insulating sheets IS have the first portions IM1 and IM3, and the second portions IM2 and IM4, which are formed of different types of materials. The thermal expansion coefficient of the first portions IM1 and IM3, and the thermal expansion coefficient of the second portions IM2 and IM4 differ from each other. Therefore, the insulating sheet IS can be curved by heating for fixing the insulating sheet IS. As the insulating sheet IS is curved, the sealing member SM comes into contact with both surfaces of the curved portion of the insulating sheet IS. Therefore, the creeping distance is increased, and the breakdown voltage of the digital isolator is improved.

Fourth Embodiment

Figure 19:
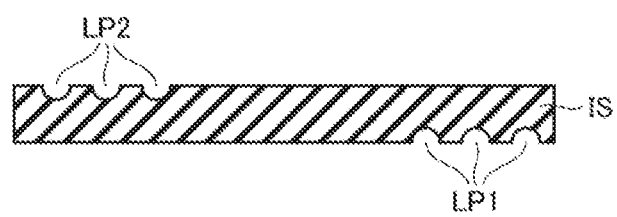
FIG. 19 is a cross-sectional view showing the configuration of the insulating sheet included in the semiconductor device of FIG. 18.

As shown in FIG. 19, the insulating sheet IS of the present embodiment has a notch LP1 on one surface of the insulating sheet IS and a notch LP2 on the other surface of the insulating sheet IS.

Figure 18:
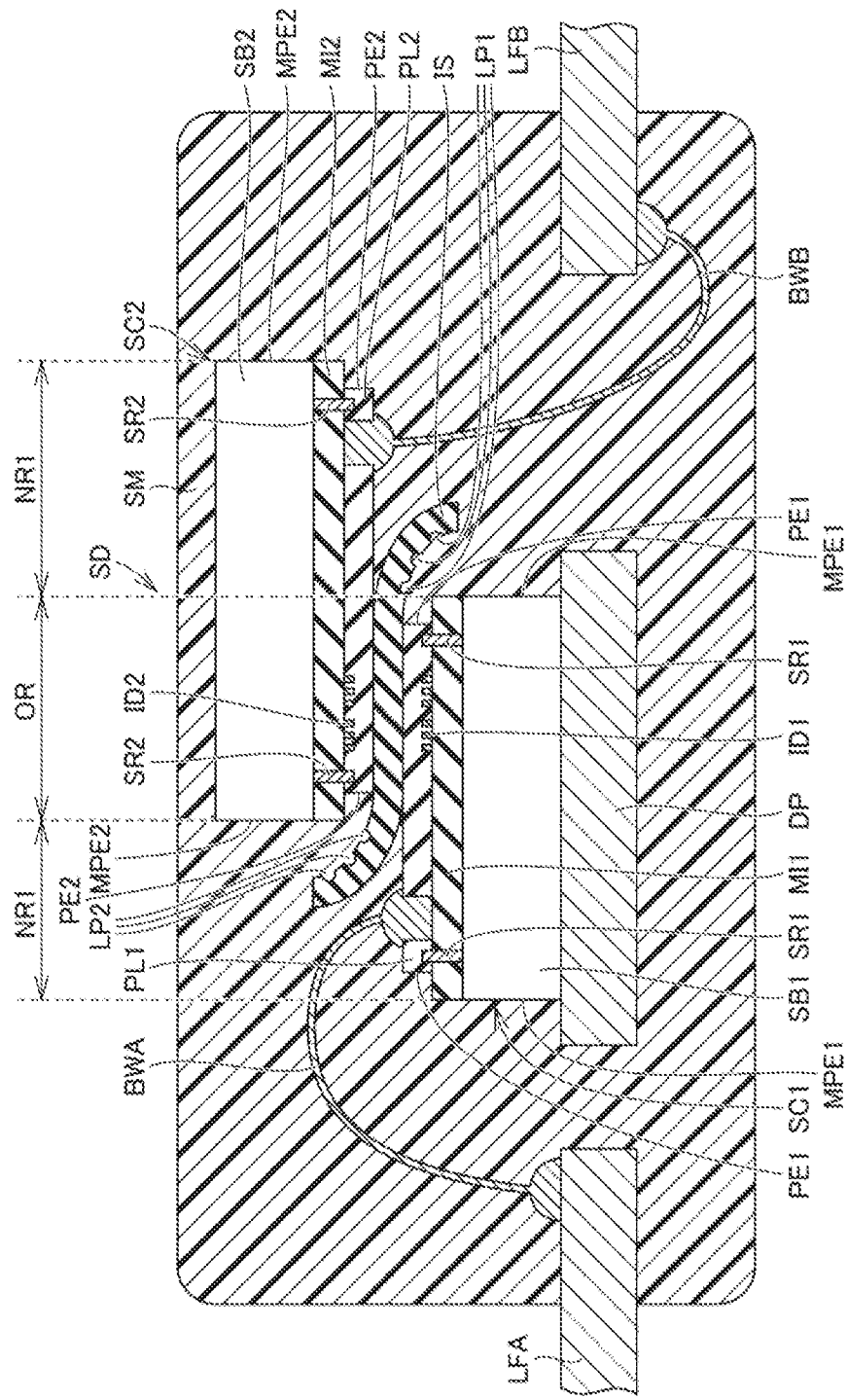
FIG. 18 is a cross-sectional view cut in the lead direction, showing the configuration of a semiconductor device in a fourth embodiment.

As shown in FIG. 18, the insulating sheet IS has notches LS1 and LS12 in portions where the insulating sheet IS is not bonded to both the first semiconductor chip SC1 and the second semiconductor chip SC2.

In the region NR1 where the second semiconductor chip SC2 is not present in the opposite region of the first semiconductor chip SC1, the notch LP2 is provided on the surface of the insulating sheet IS opposite to the first semiconductor chip SC1.

In the region NR1 where the first semiconductor chip SC1 does not exist in the opposite region of the second semiconductor chip SC2, a notch LP1 is provided on the surface of the insulating sheet IS opposite to the surface of the insulating sheet IS opposite to the second semiconductor chip SC2.

The insulating sheet IS curves away from the first semiconductor chip SC1 toward the front end of the insulating sheet IS in the region NR1 where the second semiconductor chip SC2 does not exist in the opposite region of the first semiconductor chip SC1. The insulating sheet IS curves away from the second semiconductor chip SC2 toward the front end of the insulating sheet IS in the region NR1 where the first semiconductor chip SC1 does not exist in the opposite region of the second semiconductor chip SC2.

Manufacturing method in present embodiment includes the same steps as manufacturing method in first embodiment. In the process shown in FIG. 11, heat is applied to the insulating sheet IS to fix the insulating sheet IS. This heating distorts the insulating sheet IS. For example, the insulating sheet IS expands when heated, but since the expanded portion can escape to the notch on the surface provided with the notch, the surface without the notch extends more than the surface provided with the notch.

As a result, the insulating sheet IS curves away from the first semiconductor chip SC1 toward the leading end of the insulating sheet IS in the region NR1 where the second semiconductor chip SC2 does not exist in the opposite region of the first semiconductor chip SC1. The insulating sheet IS curves away from the second semiconductor chip SC2 toward the front end of the insulating sheet IS in the region NR1 where the first semiconductor chip SC1 does not exist in the opposite region of the second semiconductor chip SC2.

Note that the configuration and manufacturing method of the semiconductor device other than the above in present embodiment are substantially the same as the configuration and manufacturing method in first embodiment, and therefore descriptions thereof will not be repeated.

In the present embodiment, the insulating sheet IS has notches LS1 and LS12 at locations where the insulating sheet IS is not bonded to both the first semiconductor chip SC1 and the second semiconductor chip SC2. Therefore, the insulating sheet IS can be curved by heating for fixing the insulating sheet IS. As the insulating sheet IS is curved, the sealing member SM comes into contact with both surfaces of the curved portion of the insulating sheet IS. Therefore, the creeping distance is increased, and the breakdown voltage of the digital isolator is improved.

In addition, since the surface area of the insulating sheet IS is increased by forming the notches LP1 and LP2 in the insulating sheet IS, the creeping distance of the interface between the insulating sheet IS and the sealing member SM is increased as compared with the creeping distance of first embodiment.

Fifth Embodiment

Figure 20:
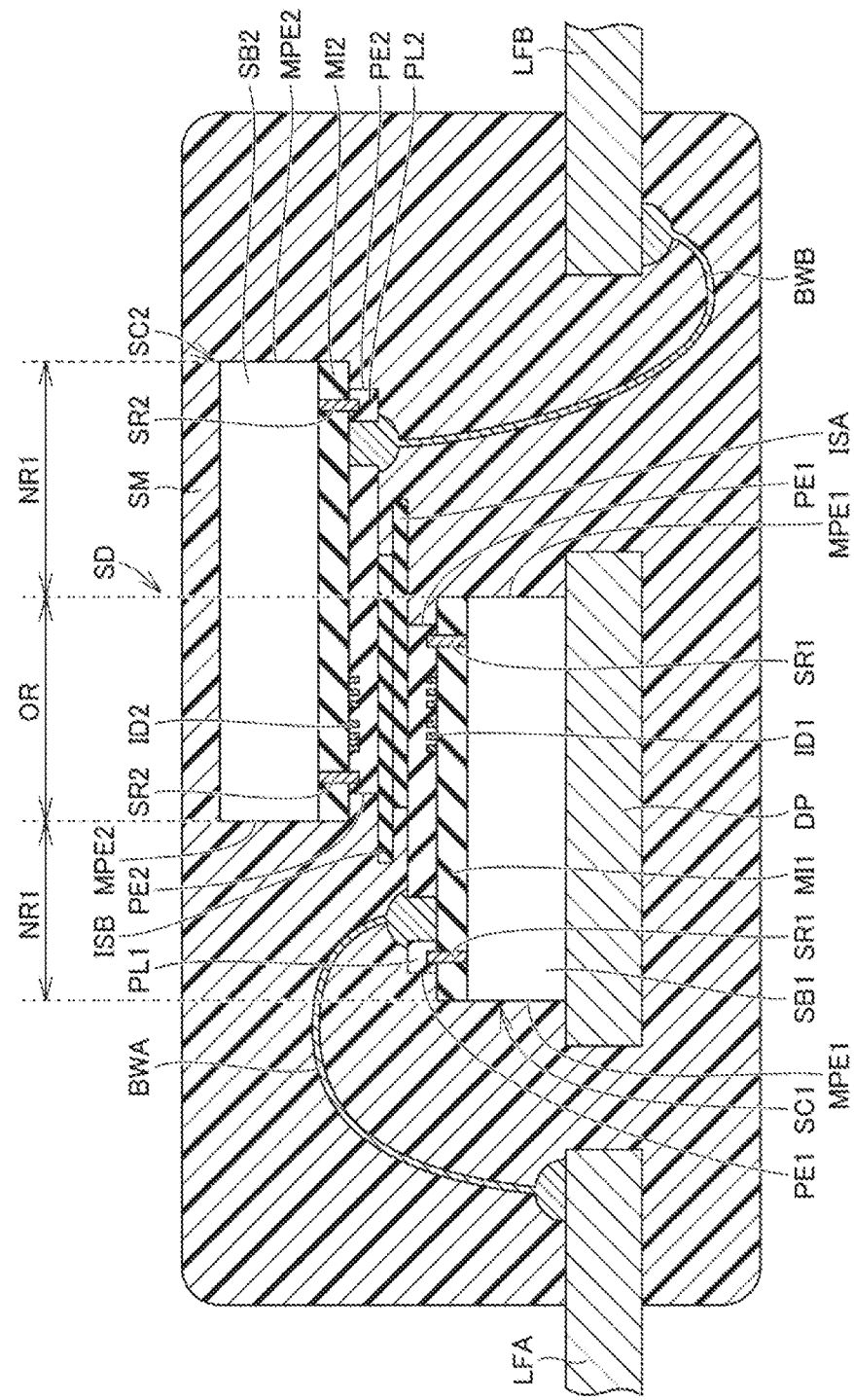
FIG. 20 is a cross-sectional view cut in the lead direction, showing a configuration of a semiconductor device in a fifth embodiment.

As shown in FIG. 20, the insulating sheet IS has a first sheet ISA and a second sheet ISB. The first sheet ISA and the second sheet ISB are arranged offset from each other and connected to each other. The first sheet ISA is located in the first semiconductor chip SC1 side, and the second sheet ISB is located in the second semiconductor chip SC2 side.

The first sheet ISA extends outward from the first outermost peripheral edge MPE1 of the first semiconductor chip SC1. The second sheet ISB extends outward from the second outermost peripheral edge MPE2 of the second semiconductor chip SC2.

The outer peripheral edge PE1 of the first passivation layer PL1 of the first semiconductor chip SC1 is located inside the first outermost peripheral edge MPE1 of the first semiconductor chip SC1. The outer peripheral edge PE2 of the second passivation layer PL2 of the second semiconductor chip SC2 is located inside the second outermost peripheral edge MPE2 of the second semiconductor chip SC2.

Note that the configuration and the method of manufacturing the semiconductor device other than the above in present embodiment are substantially the same as the configuration and manufacturing method in first embodiment, and therefore descriptions thereof will not be repeated.

In present embodiment, the first sheet ISA extends outward from the first outermost peripheral edge MPE1 of the first semiconductor chip SC1. The second sheet ISB extends outward from the second outermost peripheral edge MPE2 of the second semiconductor chip SC2. Due to the step generated in the insulating sheet IS, it is possible to secure a large creeping distance similarly to the first embodiment, and the breakdown voltage of the digital isolator is improved.

In the present embodiment, a configuration in which the insulating sheet IS is composed of two layers of the first sheet ISA and the second sheet ISB has been described, but the insulating sheet IS may be composed of three or more sheets.

Inverter systems for consumer and industrial applications require strict safety standards. According to the above-mentioned the first embodiment to the fifth embodiment, since the dielectric breakdown voltage can be improved, the inverter system for the above-mentioned consumer use and industrial use can be miniaturized. The main applications envisaged are motor-control, isolated DC (Direct Current)-DC, industrial inverters, Uninterruptible Power Supply (UPS), solar inverters, displays, illumination control, etc.

When a photocoupler is used as a digital isolator, it is difficult to incorporate the photocoupler in one package together with an Memory Control Unit (MCU), a Insulated Gate Bipolar Transistor (IGBT), a gate driver, and the like.

However, according to the above-mentioned first embodiment to the fifth embodiment, the digital isolator can be integrated in multiple channels. It is also possible to incorporate a multi-channel integrated digital isolator in one package together with a gate driver. In addition, a multi-channel integrated digital isolator can be incorporated in a single package with a gate driver and an MCU. In addition, multi-channel integrated digital isolators can be integrated into one package together with gate drivers, MCUs, and IGBT.

According to the above first embodiment to fifth embodiment, by integrating the digital isolator with the MCU, it is possible to contribute to miniaturization of the system by integrating the digital isolator with, for example, an MCU for a switching power supply, an MCU for a medical device, an MCU for an Light Emitting Diode (LED) illumination, an MCU for an automobile body system, an MCU for a general purpose automobile power system, and the like.

Although the invention made by the present inventor has been specifically described based on the embodiment, the present invention is not limited to the embodiment described above, and it is needless to say that various modifications can be made without departing from the gist thereof.

What is claimed is:

1. A semiconductor device comprising:
   a first semiconductor chip including a first inductor;
   a second semiconductor chip including a second inductor, the second semiconductor chip being stacked on the first semiconductor chip such that the second inductor faces the first inductor;
   an insulating sheet disposed between the first semiconductor chip and the second semiconductor chip; and
   a sealing member sealing the first semiconductor chip, the second semiconductor chip, and the insulating sheet,
   wherein the sealing member is disposed between the insulating sheet and the first semiconductor chip and between the insulating sheet and the second semiconductor chip,
   wherein the insulating sheet comprises:
      a first portion positioned between the first semiconductor chip and the second semiconductor chip; and
      a second portion bent with respect to the first portion, and
   wherein the sealing member contacts both a first surface of the second portion in a first semiconductor chip side and a second surface of the second portion in a second semiconductor chip side.

2. The semiconductor device according to claim 1,
wherein the first semiconductor chip has a first protective layer covering the first inductor,
wherein the second semiconductor chip has a second protective layer covering the second inductor,
wherein a first outer peripheral edge of the first protective layer is located inside a first outermost peripheral edge of the first semiconductor chip, and
wherein a second outer peripheral edge of the second protective layer is located inside a second outermost peripheral edge of the second semiconductor chip.

3. The semiconductor device according to claim 2, wherein the insulating sheet extends outward from at least one of the first outermost peripheral edge of the first semiconductor chip and the second outermost peripheral edge of the second semiconductor chip.

4. A semiconductor device comprising:
a first semiconductor chip including a first inductor;
a second semiconductor chip including a second inductor, the second semiconductor chip being stacked on the first semiconductor chip such that the second inductor faces the first inductor;
an insulating sheet disposed between the first semiconductor chip and the second semiconductor chip; and
a sealing member sealing the first semiconductor chip, the second semiconductor chip, and the insulating sheet,
wherein the sealing member is disposed between the insulating sheet and the first semiconductor chip and between the insulating sheet and the second semiconductor chip,
wherein the insulating sheet is bonded to the first semiconductor chip and the second semiconductor chip inside an opposing region where the first semiconductor chip and the second semiconductor chip face each other, and
wherein the insulating sheet is not bonded to both the first semiconductor chip and the second semiconductor chip outside the opposing region.

5. A semiconductor device comprising:
a first semiconductor chip including a first inductor;
a second semiconductor chip including a second inductor, the second semiconductor chip being stacked on the first semiconductor chip such that the second inductor faces the first inductor;
an insulating sheet disposed between the first semiconductor chip and the second semiconductor chip; and
a sealing member sealing the first semiconductor chip, the second semiconductor chip, and the insulating sheet,
wherein the sealing member is disposed between both the insulating sheet and the first semiconductor chip and between the insulating sheet and the second semiconductor chip, and
wherein the insulating sheet comprises:
a first portion; and
a second portion formed of material of a type other than the first portion.

6. The semiconductor device according to claim 5, wherein a thermal expansion coefficient of the first portion and a thermal expansion coefficient of the second portion differ from each other.

* * * * *